US012647122B2

(12) United States Patent
Aracri et al.

(10) Patent No.: US 12,647,122 B2
(45) Date of Patent: Jun. 2, 2026

(54) CLOCK FREQUENCY DRIFT COMPENSATION FOR A CLOCK GENERATOR

(71) Applicant: NXP USA, Inc., Austin, TX (US)

(72) Inventors: Umberto Aracri, Sant'Agata Li Battiati (IT); Giuseppe Spinella, Biancavilla (IT); Angelo Genova, Mascalucia (IT)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/641,132

(22) Filed: Apr. 19, 2024

(65) Prior Publication Data

US 2025/0330185 A1 Oct. 23, 2025

(51) Int. Cl.
| | |
|---|---|
| *H03K 3/011* | (2006.01) |
| *H03B 5/04* | (2006.01) |
| *H03L 7/02* | (2006.01) |
| *H03L 7/18* | (2006.01) |

(52) U.S. Cl.
CPC ................. *H03L 7/18* (2013.01); *H03B 5/04* (2013.01); *H03K 3/011* (2013.01); *H03L 7/02* (2013.01)

(58) Field of Classification Search
CPC .. H03B 5/04; H03K 3/011; H03L 1/02; H03L 1/022; H03L 7/02
See application file for complete search history.

(56) References Cited

U.S. PATENT DOCUMENTS

| | | | |
|---|---|---|---|
| 10,333,463 B2 | 6/2019 | Motz | |
| 11,581,876 B1 * | 2/2023 | Kamran | H03K 3/0315 |

| | | | | |
|---|---|---|---|---|
| 2004/0054835 A1 * | 3/2004 | Prihadi | | H03K 3/0231 |
| | | | | 710/305 |
| 2007/0241832 A1 * | 10/2007 | Nervegna | | H03K 4/501 |
| | | | | 331/176 |
| 2010/0237956 A1 * | 9/2010 | Miyashita | | H03B 5/1243 |
| | | | | 331/185 |
| 2018/0091096 A1 * | 3/2018 | Wu | | H03B 5/26 |

OTHER PUBLICATIONS

IEEE, "A Digitally Assisted Single-Point-Calibration CMOS Bandgap Voltage Reference with a 3σ Inaccuracy of ±0.08% for Fuel-Gauge Applications", 2015 IEEE International Solid-State Circuits Conference, Feb. 23, 2015, 3 pgs.
Motz, Mario, "Compensation of Mechanical Stress-Induced Drift of Bandgap References With On-Chip Stress Sensor", IEEE Sensor Journal, vol. 15, No. 9, Sep. 2015, 7 pgs.
Motz et al.; Chapter 16, pp. 297-326 of "Widebank Continuous-time ΣΔ ADCs, Automotive Electronics, and Power Management"; Advances in Analog Circuit Design 2016; Springer International Publishing Switzerland 2017.

* cited by examiner

*Primary Examiner* — Levi Gannon

(57) ABSTRACT

Clock frequency-drift compensation is described for a clock generator. In an example, an oscillator circuit includes a clock generator configured to generate an output clock signal with a clock frequency, a first variable resistor coupled to the clock generator to vary the clock frequency, and a second variable resistor. A voltage divider has a reference resistor and the second variable resistor. The voltage divider is configured to generate a reference stress voltage between the reference resistor and the second variable resistor, and a correction feedback block is configured to compare the reference stress voltage to a reference voltage, to adjust a resistance of the first variable resistor, and to adjust a resistance of the second variable resistor in response to the comparing.

14 Claims, 5 Drawing Sheets

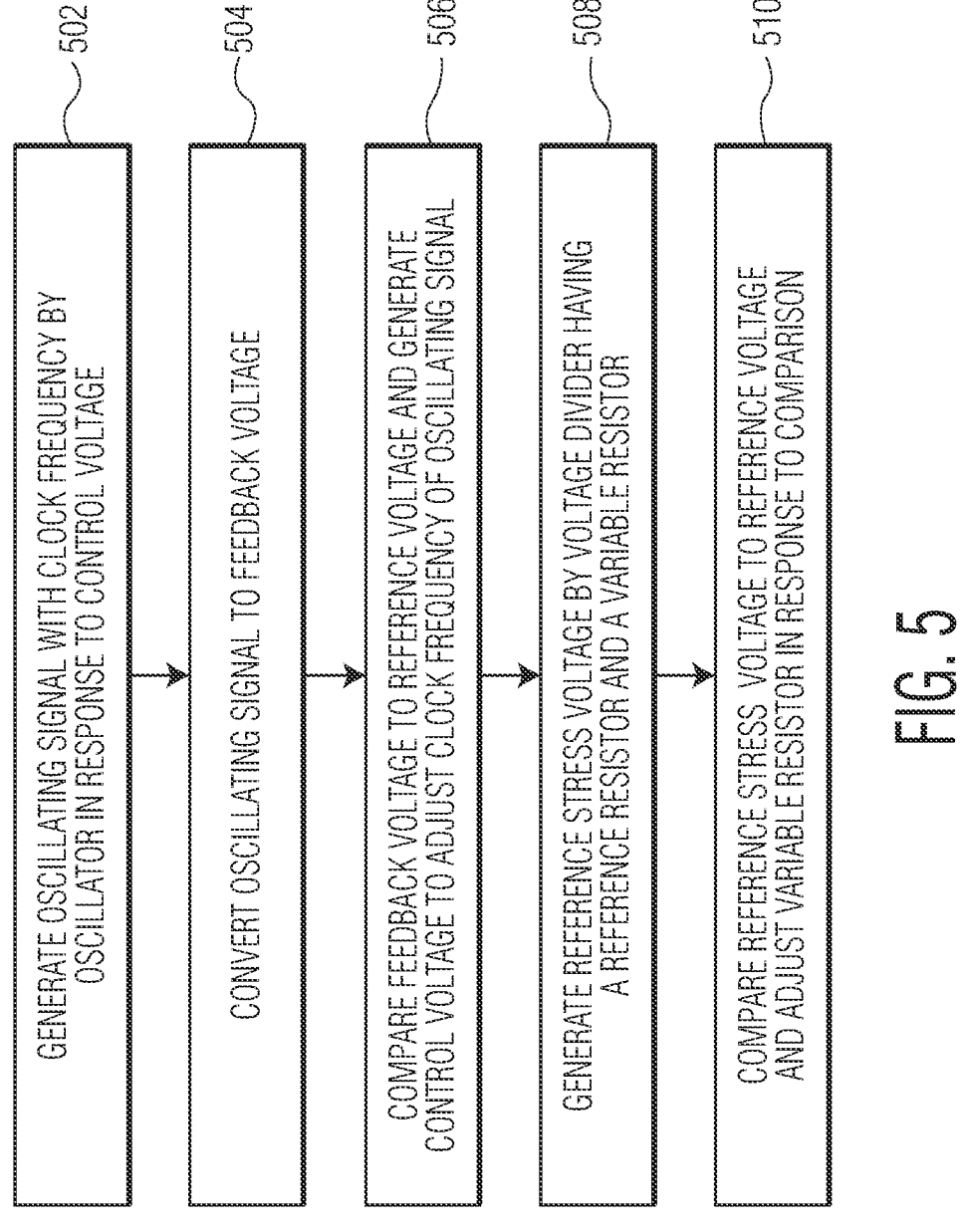

502 GENERATE OSCILLATING SIGNAL WITH CLOCK FREQUENCY BY OSCILLATOR IN RESPONSE TO CONTROL VOLTAGE

504 CONVERT OSCILLATING SIGNAL TO FEEDBACK VOLTAGE

506 COMPARE FEEDBACK VOLTAGE TO REFERENCE VOLTAGE AND GENERATE CONTROL VOLTAGE TO ADJUST CLOCK FREQUENCY OF OSCILLATING SIGNAL

508 GENERATE REFERENCE STRESS VOLTAGE BY VOLTAGE DIVIDER HAVING A REFERENCE RESISTOR AND A VARIABLE RESISTOR

510 COMPARE REFERENCE STRESS VOLTAGE TO REFERENCE VOLTAGE AND ADJUST VARIABLE RESISTOR IN RESPONSE TO COMPARISON

FIG. 5

CLOCK FREQUENCY DRIFT COMPENSATION FOR A CLOCK GENERATOR

BACKGROUND

Integrated circuits are usually subject to a change in their characteristics due to mechanical stress. Packaging, soldering, and use, among other contributors, all cause mechanical stress that leads to a gradual change in the performance of the circuitry. These errors accumulate to reduce the lifespan and usability of a device.

Mounting an integrated circuit (IC) into a protective and hermetically sealed plastic package causes a particular severe stress and strain on the IC through the semiconductor substrate upon which the IC has been formed. The IC is packaged using heat, humidity, and pressure to melt solder and to bond the parts of the package together. In some packaging technologies, a package substrate has an array of solder bumps to connect to the IC on one side. The opposite side of the package substrate has a different array of solder bumps to allow the package to be mounted to a printed circuit board. In mounting the package to a board whether by surface mount technology, ball grid array, soldered pins, or other techniques, the IC substrate is pressed against the solder bumps of the package substrate to form a solder connection to the board. The stress caused near the solder bumps by the pressure and heat of packaging and mounting can cause errors in the circuits, including the clock circuits of the IC.

SUMMARY

Embodiments of a method and apparatus for clock frequency drift compensation are disclosed for a clock generator. In an example, an oscillator circuit includes a clock generator configured to generate an output clock signal with a clock frequency, a first variable resistor coupled to the clock generator configured to vary the clock frequency, and a second variable resistor. A voltage divider has a reference resistor and the second variable resistor. The voltage divider is configured to generate a reference stress voltage between the reference resistor and the second variable resistor, and a correction feedback block is configured to compare the reference stress voltage to a reference voltage, configured to adjust a resistance of the first variable resistor, and to adjust a resistance of the second variable resistor in response to the comparing.

In some embodiments, the first variable resistor is a first resistive digital-to-analog converter (DAC).

In some embodiments, the first variable resistor is coupled between the clock generator and a ground.

In some embodiments, the first resistive DAC is controlled by a first control word and the second variable resistor is a second resistive DAC controlled by a second control word, wherein the first control word has more significant bits than the second control word.

In some embodiments, the clock generator includes an oscillator configured to generate the output clock signal, a frequency to voltage (F2V) converter configured to convert the output clock signal to a feedback voltage, and a control comparator configured to compare the feedback voltage to the reference voltage and to generate a control voltage to adjust the clock frequency of the clock output signal.

In some embodiments, the first variable resistor is coupled in series to the F2V converter between the F2V converter and ground.

In some embodiments, the first variable resistor and the second variable resistor are fabricated to be subject to degradation with the oscillator and the F2V converter.

In some embodiments, the clock generator is subject to degradation, wherein the first variable resistor and the second variable resistor are subject to the degradation, and wherein the correction feedback block is configured to adjust the first variable resistor and the second variable resistor in response to the degradation.

In some embodiments, the correction feedback logic comprises a comparator configured to receive the reference stress voltage and the reference voltage, and a counter coupled to the comparator configured to generate the first control word by counting up or down in response to the comparison.

Some embodiments include a reference voltage divider configured to generate the reference voltage, the reference voltage divider having a second reference resistor matched to the reference resistor and a third reference resistor matched to the reference resistor and configured to approximate the resistance of the variable resistor.

In some embodiments, the clock generator and the correction feedback block are fabricated on a die and the reference resistor is external to the die.

In another example a method includes generating an output clock signal with a clock frequency at a clock generator, varying the clock frequency using a first variable resistor coupled to the clock generator, generating a reference stress voltage at a voltage divider between a reference resistor and a second variable resistor, comparing the reference stress voltage to a reference voltage at a correction feedback block, and adjusting a resistance of the first variable resistor and a resistance of the second variable resistor in response to the comparing.

Some embodiments include controlling the first variable resistor by a first control word, and controlling the second variable resistor by a second control word, wherein the first control word has more significant bits than the second control word.

In some embodiments, generating an output clock signal includes generating the output clock signal at an oscillator, converting the output clock signal to a feedback voltage, comparing the feedback voltage to the reference voltage, and generating a control voltage to the oscillator to adjust the clock frequency of the clock output signal.

Some embodiments include adjusting the first variable resistor and the second variable resistor in response to degradation of the clock generator.

In some embodiments, the correction feedback logic comprises a comparator and a counter coupled to the comparator. The method includes receiving the reference stress voltage and the reference voltage at the comparator, and generating the first control word by counting up or down in the counter in response to the comparison.

In another embodiment an integrated circuit includes a plurality of clocked circuits, a supply voltage, and an oscillator circuit configured to provide an output clock signal with a clock frequency to the plurality of clocked circuits, the oscillator having a clock generator configured to generate an output clock signal with a clock frequency, a first variable resistor coupled to the clock generator configured to vary the clock frequency, second variable resistor, a voltage divider having a reference resistor and the second variable resistor, the voltage divider configured to generate a reference stress voltage between the reference resistor and the second variable resistor, and a correction feedback block configured to compare the reference stress voltage to a reference voltage, to adjust a resistance of the first variable resistor, and to adjust a resistance of the second variable resistor in response to the comparing.

In some embodiments, the first variable resistor is coupled between the clock generator and a ground.

Some embodiments include a reference voltage divider configured to generate the reference voltage, the reference voltage divider having a second reference resistor matched to the reference resistor and a third reference resistor matched to the reference resistor and configured to approximate the resistance of the variable resistor.

In some embodiments, the clock generator and the correction feedback block are fabricated on an integrated circuit die and the reference resistor is external to the integrated circuit die.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 5 is a process flow diagram of operation of drift compensation of a closed loop oscillator frequency in accordance with an embodiment of the invention.

Throughout the description, similar reference numbers may be used to identify similar elements.

DETAILED DESCRIPTION

Figure 1:
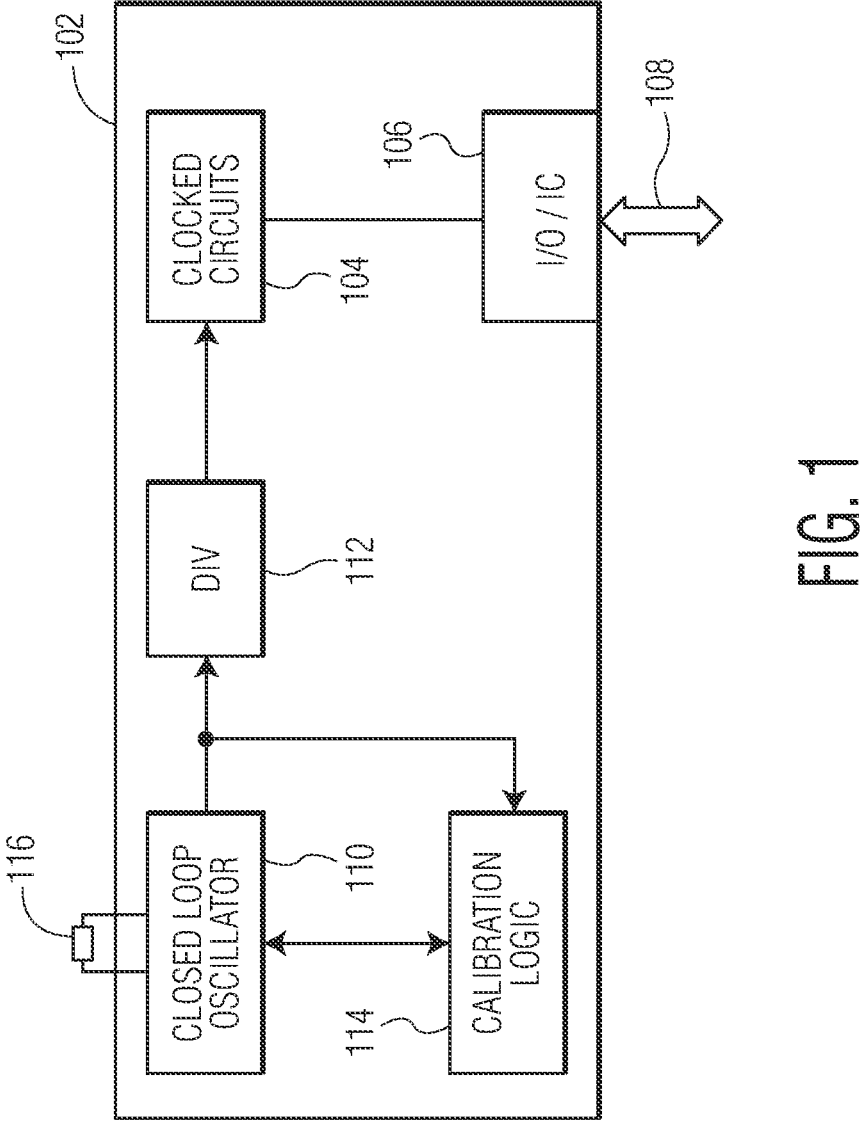
FIG. 1 is a block diagram of an integrated circuit including a clock frequency drift compensated closed loop oscillator in accordance with embodiments of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

In oscillator circuits on integrated circuit (IC) chips, the changes in the characteristics of the oscillator over time can cause a drift in the output clock signal that results in reduced performance for circuits coupled to oscillator circuit and even a failure of the coupled circuits to properly operate on assigned or required frequencies.

An initial calibration is used to correct errors from the manufacturing process and from material variations, but an initial calibration cannot accurately correct errors that develop over time. It is also expensive to calibrate each oscillator circuit after soldering. Using a closed-loop architecture, it is possible to read the stress voltage of an oscillator circuit without the use of a specific stress sensor. The clock frequency of an output clock signal is dynamically trimmed in order to compensate for frequency drift due to stress or aging of the active and passive devices inside the oscillator circuit. An initial calibration may be performed after the packaging of a chip in order to correct initial stress effects. An automatic digital correction may be applied without the use of complex digital circuitry. As an example, expensive analog-to-digital converters may be avoided.

FIG. 1 is a block diagram of an integrated circuit (IC) 102 with a clock frequency drift compensated closed loop oscillator as described herein. In embodiments, the drift compensation is an active drift compensation. The IC 102 has clocked circuits 104. The clocked circuits 104 may be of any suitable type for computation, signal processing, sensing, receiving, and transmitting. The clocked circuits are coupled to an Input/Output (I/O) interface 106 to communicate with other components through a data and control bus 108. One or more I/O interfaces and buses may be used to suit different applications. A clock generator 110 generates a clock signal. The clock signal may be derived from an internal reference, an external reference, or an oscillator, e.g., a phase-locked loop (PLL), a voltage-controlled oscillator (VCO), a crystal oscillator, (XO), an external reference clock, etc. The clock signal is coupled to a divider 112 to divide the clock signal by one or more different integers and then provide each divided clock signal as one of a variety of clock output lines to the clocked circuits 104.

To maintain accuracy, calibration logic 114 is coupled to the clock generator to adjust the clock signal. The calibration logic receives the clock signal or a representation of the clock signal and adjusts the clock signal based on one or more suitable references. The IC 102 optionally includes input and output pins to connect to an external reference component 116, e.g. a resistor or oscillator. The external reference component 116 may be used by the calibration logic 114 and by the clock generator 110 to maintain accuracy.

Figure 2:
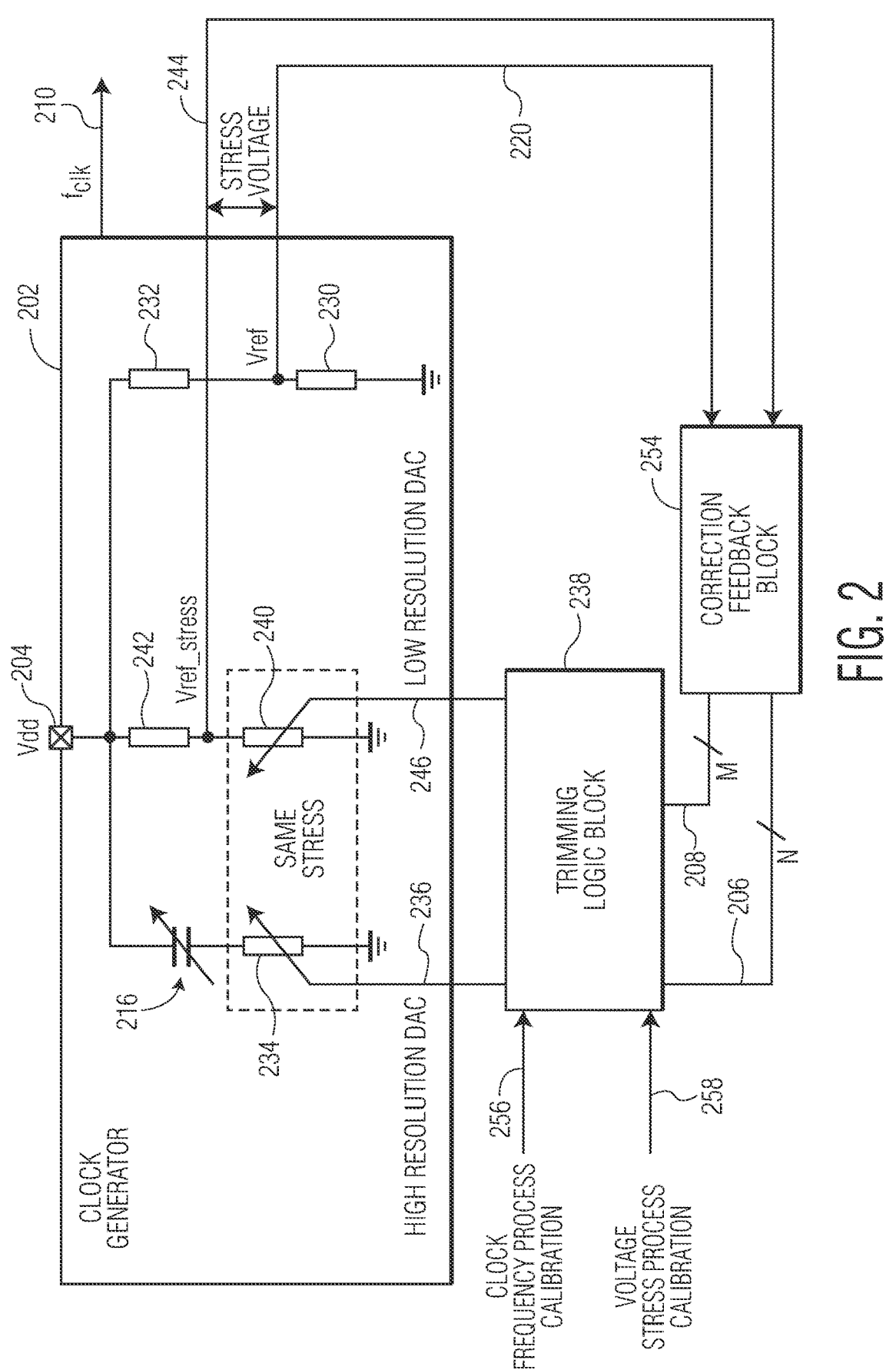
FIG. 2 is a diagram of a drift compensated closed loop oscillator in accordance with embodiments of the invention.

FIG. 2 is a diagram of a drift compensated closed loop oscillator. The drift compensated closed loop oscillator 200 may be part of an IC. A clock generator 202 generates an output clock signal 210. This is an oscillating signal with a clock frequency designated as folk. The output clock signal 210 may be distributed and divided throughout the IC for use by any of a variety of different clocked circuits of the IC. The output clock signal is also fed back to a Frequency to Voltage (F2V) converter 216 represented here as a variable capacitor over a resistance. The F2V converter 216 output is used to provide a feedback signal to correct the frequency of the output clock signal 210. The F2V converter 216 is represented as a variable capacitor over a resistance because it has a frequency-driven internal capacitance and an inherent resistance that allows its voltage output to be adjusted by the use of a variable resistance in a first DAC 234 as described below.

A reference voltage 220, Vref, is generated by a resistive divider with a first reference resistor 230 with resistance R1 and a second reference resistor 232 with resistance R2, where, in some embodiments, R2=k×R1. The resistive divider for the reference voltage 220 has a k ratio of the supply voltage, Vdd 204.

The voltage drift of the F2V converter 216 and a drift in the clock frequency of the output clock signal 210, due to stress or aging, may be adjusted by adjusting the resistance of a variable resistor, a first DAC 234. The first DAC 234 is placed between the F2V converter 216 and ground. A drift in the output clock signal is read as a difference between reference voltage 220, Vref, and a reference stress voltage 244, Vref_stress, which is a tap of a second resistive divider with the same resistor ratio as for the reference voltage 220. The difference is labeled as the stress voltage. The second resistive divider is made up of another variable resistor, a second DAC 240, and a third reference resistor 242. The third reference resistor 242 is fabricated or placed in a low-stress zone inside the chip, e.g., a zone that is away from bump stress during packaging. In an alternative, the reference resistors may be composed of two different resistors that have opposite stress coefficients.

The second DAC 240 may be placed or fabricated close to the first DAC 234 so that it experiences roughly the same stress effect as the first DAC 234 and so that it is affected by the same drift. Both dividers are connected to (placed under) the same main supply voltage, Vdd, so that they experience the same supply voltage variation, if any. This architecture is configured to be insensitive to any supply variation.

The second DAC 240 has a lower resolution for resistance adjustments than the first DAC 234. The second DAC 240 differs from the first DAC 234 only, or in part, in the number of bits. In embodiments, the resolution in terms of accuracy is the same. In other words, the two least significant bit (LSB) for each is the same but the first DAC 234 has one or more most significant bits (MSB) so that the range covered by the N bits of the first DAC 234 is greater than the range covered by the fewer M bits of the second DAC 240. With this configuration the M bits of the second DAC 240 may cover a frequency variation of 1-3%, due to stress and life time variation. The N bits of the first DAC 234 may cover also process variations, that may be on the order of 15-25%. Consequently, in this example, the two counters are different in terms of covered range, but they have the same LSB.

The reference voltage 220 and the reference stress voltage 244 are both provided to a correction feedback block 254. The correction feedback block 254 compares the voltages to determine the stress voltage and generates an M-bit control word 208, a first control word, on an M-bit control line and an N-bit control word 206, a second control word, on an N-bit control line in response to the stress voltage. In examples, the M-bit control word is a lower resolution version of the N-bit control word. In examples, N is greater than N. The M-bit control line is coupled to a trimming logic block 238 that has a control line 246 to the second DAC 240. The reference stress voltage 244 is controlled by the value of the second DAC 240 because the values of the reference resistors 242, 230, 232 are fixed.

The correction feedback block adjusts the N-bit control word 206 and the M-bit control word 208 to change the resistance of the first DAC 234 and the resistance of the second DAC 240, respectively. The correction feedback block 254 may include a digital filter in order to avoid toggling of the last significant bit of the N-bit control word 206 and the M-bit control word 208 in response to the stress voltage due to noise and other spurious effects.

The N-bit control line is also coupled to the trimming logic block 238 that also has a control line 236 to the first DAC 234. The resistance of the first DAC 234, as controlled by the N-bit control word, changes the output control voltage of the F2V converter 216 that in turn corrects the clock frequency of the output clock signal 210 until the reference stress voltage 244 matches the reference voltage 220, within the minimum LSB allowed by the correction feedback block 254.

The trimming logic block 238 is coupled between the correction feedback block 254 and the first DAC 234 and between the correction feedback block 254 and the second DAC 240. The trimming logic block 238 is configured to receive a clock frequency process calibration 256 for the clock frequency from an external calibration mechanism. The initial calibration may be used, for example, to correct the clock frequency against manufacturing differences between chips and wafers. The trimming logic block 238 may also be configured to receive a voltage stress process calibration 258 also for the stress voltage, for example, to correct for later stresses from packaging and other processes. The voltage stress process calibration may be used to set the calibration loop through the trimming logic block 238 to a OV correction. In other words, the first DAC 234 and the second DAC 240 are set so that the stress voltage is zero, i.e., so that the reference stress voltage 244 matches the reference voltage 220. When the clock generator 202 is calibrated by the external calibration mechanism, then the trimming logic block receives a trim word to apply as an initial N-bit value to the first DAC 234. In an example, the reference stress voltage 244 may be trimmed before packaging to OV by trimming the resistance of the second DAC 240 with the M-bit word. The trimming logic block 238 may be used to store calibration factors and the adjustments received from the correction feedback block 254.

Figure 3:
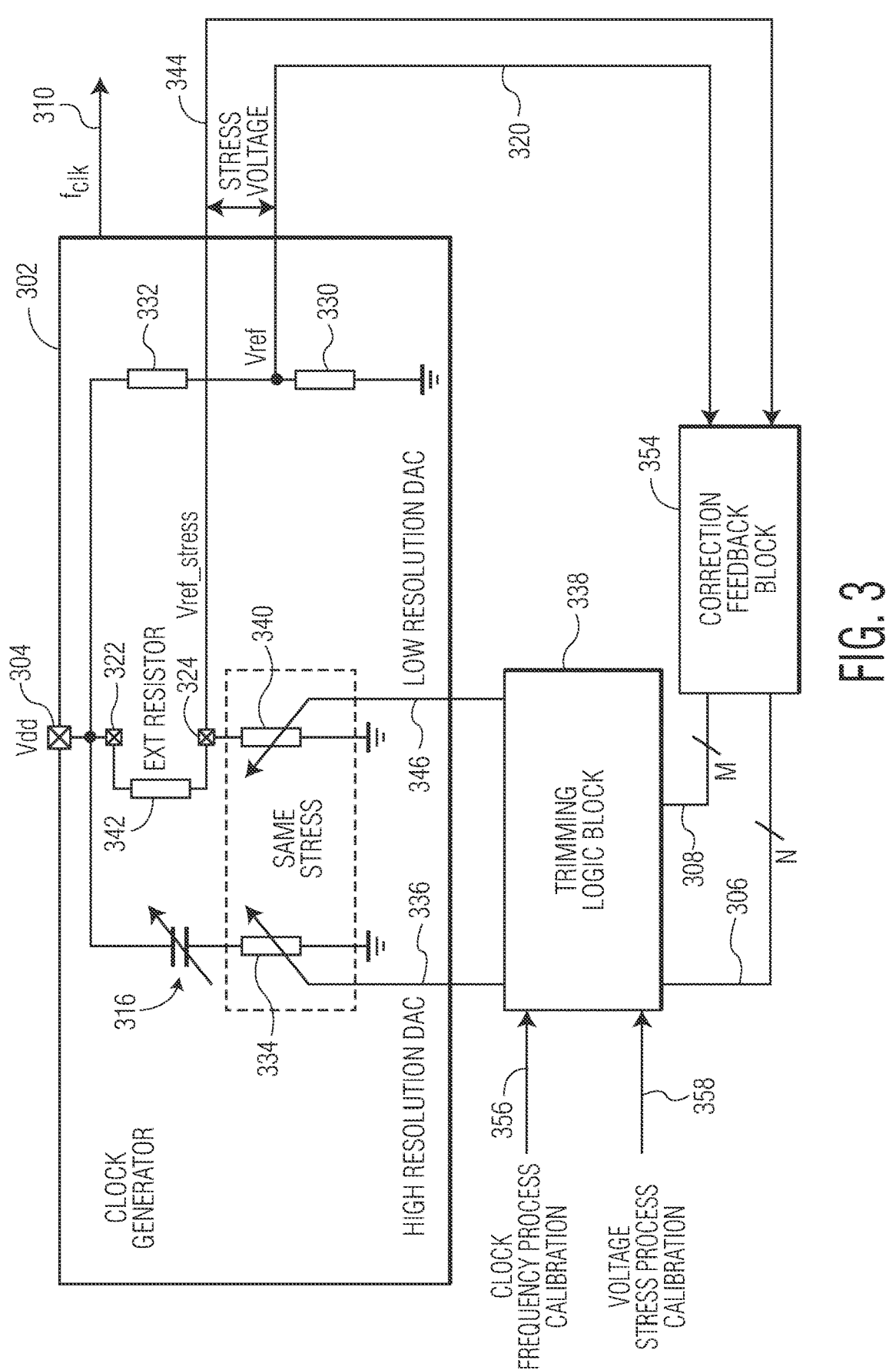
FIG. 3 is another diagram of a drift compensated closed loop oscillator in accordance with embodiments of the invention.

FIG. 3 is an alternative diagram of a drift compensated closed loop oscillator. The diagram is simplified, similar to FIG. 2, to more easily show the operation of the compensation and the use of an external resistor. FIG. 3 is similar to FIG. 2 except that it uses an external resistor 342 instead of the internal or on-die resistor as the third reference resistor 242 of FIG. 2. The clock generator 302 generates an output clock signal 310 as an output oscillating signal with a clock frequency, folk, to drive other components of a larger system. The external resistor 342 is coupled between a first dedicated resistor pad 322 and a second dedicated resistor pad 324 for the external resistor connection. The first dedicated resistor pad 322 may be coupled directly to a Vdd pad coupled to the supply voltage 304 of the IC. The external resistor 342 may be selected to have good accuracy and low drift, e.g., 0.05%-1% with a temperature coefficient (TC) of 100 ppm/° C. An internal resistor as shown in FIG. 2 may alternatively be used.

The external resistor 342 is coupled to a supply voltage 304, Vdd, on one side and in series to a second DAC 340 to form a resistive voltage divider to generate a reference stress voltage 344 between the external resistor 342 and the second DAC 340. The reference stress voltage 344 is coupled to a correction feedback block 354. The reference stress voltage 344 is affected by the stress on the second DAC 340 due to thermal, physical, and other stresses. The second DAC 340 may be configured to experience stresses similar to those of the components that generate the output clock signal 310.

The supply voltage 304 is also provided to a first reference resistor 332 and a second reference resistor 330 in series and matched to the first reference resistor 332 to form a reference voltage divider that produces a reference voltage 320 that is stress independent by construction. The reference voltage is also applied to the correction feedback block 354. The correction feedback block 354 compares the reference stress voltage 344 and the reference voltage 320 and generates an M-bit control word 308, a first control word, as an output to adjust the resistance of the second DAC 340 through a trimming logic block 338. With each adjustment, the reference stress voltage comes closer to matching the reference voltage and compensating for the stress that was applied to the first DAC 334.

The output clock signal 310 is applied to a feedback circuit, e.g., an F2V converter 316, represented by a variable capacitor to close the loop of the clock generator 302 and maintain the stability of the output clock signal 310. The F2V converter 316 is coupled to the supply voltage 304 on one side and to the first DAC 334 on the other side. The first DAC 334 has an adjustable resistance determined by an N-bit control word 336, a second control word, that is coupled to the first DAC 334 through a trimming logic block 338. The correction feedback block 354 generates the N-bit control word 306 using the same comparison and simultaneous with the M-bit control word 308. The N-bit control word 306 controls the resistance of the first DAC 334 which affects a voltage output control signal of the F2V converter 316 which controls the clock generator 302 to generate the output clock signal 310 as described in more detail in the context of FIG. 4.

The stress effect on the clock generator 302 is emulated by changing the resistance of the first DAC 334. Consequently, comparators in the correction feedback block 354 detect the change in the reference stress voltage 344 relative to the reference voltage 320 as a stress voltage and change the code words that are sent to the first DAC 334 until the stress voltage becomes less than an LSB of the N-bit control word 306. Therefore, the clock frequency of the output clock signal 310 converges to an accurate value.

Considering the operation of the clock frequency drift compensation as shown in FIG. 3, the first reference resistor 332 and the second reference resistor 330 are selected to be similar in value and in characteristics. The purpose is to reduce the effect of the stress and lifetime changes on Vref. In some examples, the resistors are matched and consequently suffer the same stress and the same lifetime. In contrast, the first DAC 334 and the second DAC 340 are specifically configured, fabricated, and positioned to suffer a stress and lifetime degradation that is like the clock generator circuit.

The clock generator 302 degrades due to stress and lifetime variations. In particular, the system may degrade after packaging the clock generator and associated components on a die into a package and when mounting the package on a board. When the stress voltage is no longer zero, then a secondary comparator of the logic block drives an up/down counter that increases or decreases the M-bit word control word 308 for the second DAC 340. The M-bit control word 308 changes the resistance of the second DAC 340 until the stress voltage is zero, e.g., it is less than the offset of comparators of the correction feedback block 354. Meanwhile the N-bit control word 306 changes the resistance of the first DAC 334 correcting the clock frequency of the output clock signal 310 until the stress voltage goes close to zero, e.g., below the comparator offset. As in the example of FIG. 2, the trimming logic block 338 provides the adjustments to the first DAC 334 and the second DAC 340. The trimming logic block also receives a clock frequency process calibration 356 and a voltage stress process calibration 358 from an external component to provide the initial conditions for the drift compensation loop through the correction feedback block 354.

Figure 4:
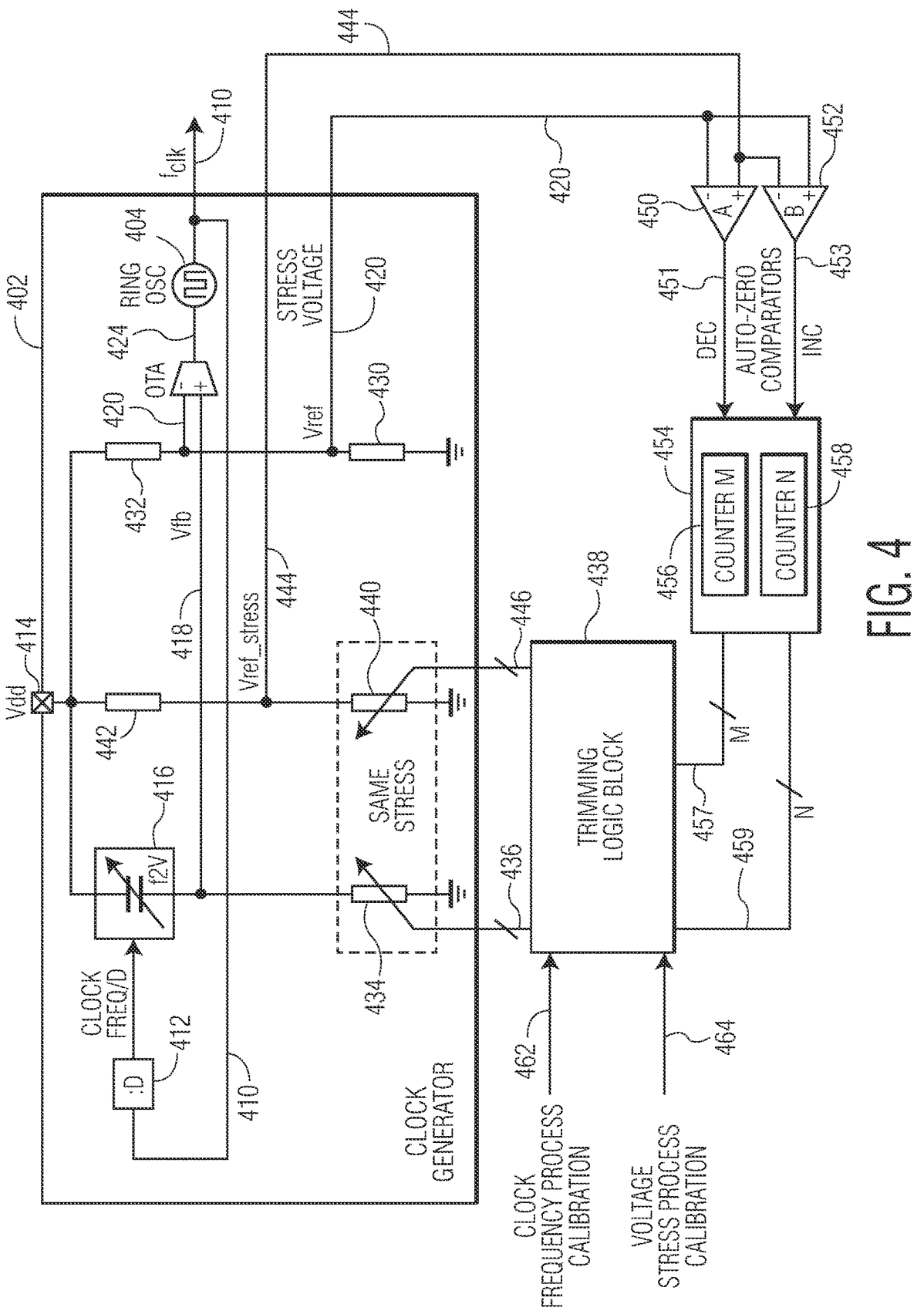
FIG. 4 is another diagram of a drift compensated closed loop oscillator in accordance with embodiments of the invention.

FIG. 4 is a diagram of a drift compensated closed loop oscillator. The closed loop oscillator 400 includes a clock generator 402 with a ring oscillator 404 of any suitable type, e.g., a Voltage-Controlled Oscillator (VCO), placed inside a control loop system within the clock generator 402. The ring oscillator 404 generates an output clock signal 410 with a clock frequency designated as folk. The output clock signal is coupled to a divider 412 which performs a divide by D operation and the resulting output signal has a frequency of folk/D. This signal is fed to a Frequency to Voltage (F2V) converter 416.

The F2V converter 416 output Vfb is the feedback voltage 418, a signal to correct the frequency of the ring oscillator 404. The feedback voltage 418 of the F2V converter 416 varies in voltage with the frequency of the ring oscillator 404 and is connected to an input of a comparator, e.g., an Operational Transconductance Amplifier (OTA) 422. A reference voltage 420, Vref, is connected to another input of the OTA 422. The OTA compares the voltage coming from the F2V converter 416, Vfb, to the reference voltage, Vref, to generate an error voltage 424. The error voltage 424 from the OTA is used to control the frequency of the ring oscillator.

In some embodiments, the reference voltage 420, Vref, is generated by a resistive divider with a first reference resistor 430 with resistance R1 and a second reference resistor 432 with resistance R2, wherein R2=k×R1. The resistive divider for the reference voltage 420 has a k ratio of the supply voltage, Vdd, 414. The resistors 430, 432 of the reference voltage 420 are configured to have a consistent resistance over the life of the oscillator.

Any frequency deviation of the clock frequency at the output clock signal 410 of the ring oscillator 404, will be corrected by the control loop, that includes the OTA 422 making a comparison of the feedback voltage 418, Vfb, to the reference voltage 420, Vref, as long as the control loop has enough gain. The accuracy of the output clock signal 410 depends, in a first approximation, on the R×C product of the control loop, where C is a capacitance of part of the F2V converter 416, and R is an equivalent resistance of a first digital-to-analog converter DAC 434. The first DAC 434 may be connected on one side to the F2V converter 416 and on the other side to ground. The first DAC 434 may be a resistive high-resolution N-bit DAC that receives an N-bit control word 459, the second control word, through a trimming logic block 438. The N-bit control word 459 is used to change the resistance of the first DAC 434. This change in the resistance changes the R×C product so that the first DAC 434 calibrates the F2V converter 416 against process variation changes and consequently calibrates the oscillator frequency of the output clock signal 410 generated by the ring oscillator 404.

The voltage drift of the F2V converter 416 and the ring oscillator 404, due to stress or aging, is read as a difference between the reference voltage 420, Vref, which is a tap of the resistive divider with a fixed resistor ratio between the first reference resistor 430 with resistance R1 and the second reference resistor 432 with resistance R2, and a reference stress voltage 444, Vref_stress, which is a tap of a second resistive divider with the same nominal resistor ratio. The second resistive divider may be made up of a resistive low-resolution second DAC 440 and a third reference resistor 442. The third reference resistor is fabricated or placed in a low-stress zone inside the chip, e.g., a zone that is protected from bump stress. In an alternative, the third reference resistor 442 may be composed of two different resistors that have opposite stress coefficients. In an alternative, the third reference resistor 442 may be external as shown in FIG. 3.

The reference voltage 420 and the reference stress voltage 444 are both provided to a pair of comparators. A first comparator 450 reads this voltage difference and generates a decrease control signal 451. A second comparator 452 reads this voltage difference and generates an increase control signal 453. The decrease control signal 451 and the increase control signal 453 are applied to digital counters 456, 458 placed inside the logic block 454 in order to increase or decrease an M-bit control word 457, a first control word, that is provided to the second DAC 440, and an N-bit control word 459, that is provided to the first DAC 434.

The M-bit control word 457 is adjusted by an M-bit digital counter 456 inside the logic block 454, until the reference stress voltage 444 matches the reference voltage 420 to within the offset of the comparators, e.g., as accurate a match as the comparator accuracy will allow. The M-bit control word 457 is received at a trimming logic block 438. The trimming logic block generates a command 446 to the second DAC 440 based on the M-bit control word 457. The comparators may be made to be virtually identical so that they have roughly the same offset. If the difference between the Vref, the reference voltage 420 and Vref_stress, the reference stress voltage 444 is less than the comparator offset both the increase control signal 453 and the decrease control signal 451 will be zero and the counters will be stopped, i.e., the counters will not decrement or increment the M-bit and N-bit control words.

An N-bit digital counter 458 generates the N-bit control word 459 that is applied to the first DAC 434. The resistance of the first DAC 434, as adjusted by a command 436 through the trimming logic block 438, changes the voltage of the F2V converter 416 and corrects the frequency of the output clock signal 410 of the ring oscillator 404 until the reference stress voltage 444 matches the reference voltage 420, within the offset of the comparators. In embodiments, the first DAC 434 may be configured such that 1 LSB corresponds to an accuracy of between ±0.1% and ±0.3% of the target frequency for the clock generator 402. A variation of ±1% of the total resistance of the first DAC 434 and the F2V converter 416 due to the soldering stress or aging, will be felt by the stress voltage and be automatically corrected by increasing or decreasing the N-bit control word to the first DAC 434.

An additional feature of the described compensation is the suitability for process calibration and initial calibration. An external component (not shown) may perform a process calibration, e.g. at wafer lever, and make adjustments by sending a clock frequency process calibration 462 as a control signal through a trimming logic block 438 to adjust an initial resistance of the second DAC 440. In examples, the stress voltage may be driven to zero before packaging by a factory process to set a new value for M through a voltage stress process calibration 464. Similarly, the same or other calibration processes include a voltage stress process calibration 464 in which an external component (not shown) may perform a calibration and send a voltage stress process calibration 464 as a control signal through the trimming logic block 438 to the first DAC 434 to adjust the resistance of the first DAC 434. This procedure sets an appropriate output frequency, folk, of the output clock signal 410 at a factory level. The trimming logic block 438 stores the initial trimming words of the clock frequency process calibration 462 and the voltage stress process calibration 464.

The double calibration, i.e., the calibration applied to the first DAC 434 and the second DAC 440 allows the stress voltage to be set to a value that is below the LSB of the comparators 450, 452 coupled to the logic block 454. A simple digital circuit may be implemented in the logic block 454 in order to remove the possible toggling of the last significant bit of the counter, e.g., from noise, by digital filtering.

FIG. 5 is a process flow diagram of an operation of clock frequency drift compensation for a closed loop oscillator as described herein. At 502, a clock signal with a clock frequency is generated by a clock generator. The clock signal may be generated by a ring oscillator, e.g., a VCO in response to a feedback control voltage through a closed loop control mechanism. In some embodiments, the output clock signal is converted to a feedback voltage. The feedback voltage is compared to the reference voltage, and a control voltage is generated to the oscillator to adjust the clock frequency of the clock output signal.

At 504, the clock frequency is varied using a first variable resistor coupled to the clock generator.

At 506, a reference stress voltage is generated at a voltage divider between a reference resistor and a second variable resistor.

At 508, the reference stress voltage is compared to a reference voltage at a correction feedback block. In embodiments, the correction feedback logic includes a comparator and a counter. The comparator receives the reference stress voltage and the reference voltage and the counter generates the first control word by counting up or down in the counter in response to the comparison.

At 510, a resistance of the first variable resistor and a resistance of the second variable resistor is adjusted in response to the comparing. The first variable resistor may be adjusted by a first control word and the second variable resistor may be controlled by a second control word. In embodiments, the first control word has more significant bits than the second control word. The adjustment may be made in response to the degradation of the clock generator. Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An oscillator circuit comprising:
a clock generator configured to generate an output clock signal with a clock frequency;
wherein the clock generator includes,
a first variable resistor configured to vary the clock frequency;
a second variable resistor; and
a voltage divider having a reference resistor and the second variable resistor,
wherein the voltage divider is configured to generate a reference stress voltage between the reference resistor and the second variable resistor; and
a correction feedback block coupled to the clock generator and configured to compare the reference stress voltage to a reference voltage, to adjust a resistance of the first variable resistor, and to adjust a resistance of the second variable resistor in response to the comparing;
wherein the clock generator includes,
an oscillator configured to generate the output clock signal;
a frequency to voltage (F2V) converter configured to convert the output clock signal to a feedback voltage; and
a control comparator configured to compare the feedback voltage to the reference voltage and to generate a control voltage to adjust the clock frequency of the clock output signal.

2. The oscillator circuit of claim 1, wherein the first variable resistor is a first resistive digital-to-analog converter (DAC).

3. The oscillator circuit of claim 2, wherein the first resistive DAC is controlled by a first control word and the second variable resistor is a second resistive DAC controlled by a second control word, wherein the first control word has more significant bits than the second control word.

4. The oscillator circuit of claim 1, wherein the first variable resistor is coupled to a ground.

5. The oscillator circuit of claim 1, wherein the first variable resistor is coupled in series to the F2V converter between the F2V converter and ground.

6. The oscillator circuit of claim 1, wherein the first variable resistor and the second variable resistor are fabricated to be subject to degradation with the oscillator and the F2V converter.

7. The oscillator circuit of claim 1, wherein the clock generator is subject to degradation, wherein the first variable resistor and the second variable resistor are subject to the degradation, and wherein the correction feedback block is configured to adjust the first variable resistor and the second variable resistor in response to the degradation.

8. The oscillator circuit of claim 1, wherein the correction feedback block comprises a comparator configured to receive the reference stress voltage and the reference voltage, and a counter coupled to the comparator configured to generate the first control word by counting up or down in response to the comparison.

9. The oscillator circuit of claim 1, further comprising a reference voltage divider configured to generate the reference voltage, the reference voltage divider having a second reference resistor matched to the reference resistor and a third reference resistor matched to the reference resistor and configured to approximate a resistance of the first variable resistor.

10. The oscillator circuit of claim 1, wherein the clock generator and the correction feedback block are fabricated on a die and the reference resistor is external to the die.

11. An integrated circuit comprising:
a plurality of clocked circuits;
a supply voltage input; and
an oscillator circuit configured to provide an output clock signal to the plurality of clocked circuits,
the oscillator having
a clock generator configured to generate the output clock signal with a clock frequency,
wherein the clock generator includes,
a first variable resistor configured to vary the clock frequency,
a second variable resistor, and
a voltage divider having a reference resistor and the second variable resistor,
wherein the voltage divider is configured to generate a reference stress voltage between the reference resistor and the second variable resistor, and
a correction feedback block coupled to the clock generator and configured to compare the reference stress voltage to a reference voltage, to adjust a resistance of the first variable resistor, and to adjust a resistance of the second variable resistor in response to the comparing;
wherein the clock generator further includes,
a reference voltage divider configured to generate the reference voltage;
wherein the reference voltage divider includes a second reference resistor matched to the reference resistor and a third reference resistor matched to the reference resistor and configured to approximate a resistance of the first variable resistor.

12. The integrated circuit of claim 11, wherein the first variable resistor is coupled to a ground.

13. The integrated circuit of claim 11, wherein the clock generator and the correction feedback block are fabricated on an integrated circuit die and the reference resistor is external to the integrated circuit die.

14. An oscillator circuit comprising:
a clock generator configured to generate an output clock signal with a clock frequency;
wherein the clock generator includes,
a first variable resistor configured to vary the clock frequency;
a second variable resistor; and
a voltage divider having a reference resistor and the second variable resistor,
wherein the voltage divider is configured to generate a reference stress voltage between the reference resistor and the second variable resistor; and
a correction feedback block coupled to the clock generator and configured to compare the reference stress voltage to a reference voltage, to adjust a resistance of the first variable resistor, and to adjust a resistance of the second variable resistor in response to the comparing;
wherein the first variable resistor is a first resistive digital-to-analog converter (DAC);
wherein the first resistive DAC is controlled by a first control word and the second variable resistor is a second resistive DAC controlled by a second control word; and
wherein the first control word has more significant bits than the second control word.

* * * * *